United States Patent

Scholz et al.

Patent Number: 5,471,946
Date of Patent: Dec. 5, 1995

[54] METHOD FOR PRODUCTING A WAFER WITH A MONOCRYSTALLINE SILICON CARBIDE LAYER

[75] Inventors: Christoph Scholz, Munich; Franz Koehl, Burghausen; Thomas Weber, Munich, all of Germany

[73] Assignee: CS Halbleiter-und Solartechnologie GmbH, Munich, Germany

[21] Appl. No.: 136,115

[22] Filed: Oct. 13, 1993

[30] Foreign Application Priority Data

Oct. 13, 1992 [DE] Germany ............... 42 34 508.1

[51] Int. Cl.$^6$ ................................ C30B 25/16
[52] U.S. Cl. ................................ 117/84; 117/90
[58] Field of Search ............. 117/84, 90, 930; 437/100

[56] References Cited

U.S. PATENT DOCUMENTS 4,855,254  8/1989  Eshita et al. .................. 437/100

FOREIGN PATENT DOCUMENTS

| | | |
|---|---|---|
| 3446956A1 | 7/1985 | Germany . |
| 3613012A1 | 11/1986 | Germany . |
| 4109005C1 | 9/1992 | Germany . |
| 55-105000 | 11/1980 | Japan . |
| 55-144500 | 11/1980 | Japan . |
| 55-104998 | 11/1980 | Japan . |
| 55-104999 | 11/1980 | Japan . |
| 56-45897 | 4/1981 | Japan . |
| 1162326 | 6/1989 | Japan . |

Primary Examiner—R. Bruce Breneman
Assistant Examiner—Felisa Garrett
Attorney, Agent, or Firm—Flynn, Thiel, Boutell & Tanis

[57] ABSTRACT

To produce a large-surface wafer, a monocrystalline SiC layer (4) is grown epitaxially on a monocrystalline Si layer (1) provided with a nucleation layer (3) by carbonization. On the monocrystalline SiC layer (4), a polycrystalline SiC layer (5) is deposited. The Si layer is then etched away, resulting in a wafer consisting of a compound of monocrystalline and polycrystalline SiC layers (4, 5) and meeting the highest demands of semiconductor technology.

5 Claims, 1 Drawing Sheet

METHOD FOR PRODUCING A WAFER WITH A MONOCRYSTALLINE SILICON CARBIDE LAYER

The present invention relates to a method for producing a wafer with a monocrystalline silicon carbide (SIC) layer as shown in DE 41 09 005 C1. In the compound obtained by (hetero-)epitaxial growth consisting of a monocrystalline silicon (Si) substrate and a monocrystalline SiC layer, Si and SiC have very different coefficients of thermal expansion; SiC contracts more than Si when cooled. This causes the substrate to curve greatly and the SiC layer grown on Si to tear or the substrate to break, particularly in wafers with a large diameter. According to DE 41 09 005 C1, the compound of the grown SiC layer and Si substrate is therefore not cooled from the temperature at which the epitaxial growth is conducted, i.e. from e.g. 1300° to 1400° C. This compound is instead heated further, preferably to just under or to over the melting point of silicon so that the Si substrate is melted off the compound or vaporized by sublimation and leaves a wafer comprising the monocrystalline SiC layer. Although the known method has proven workable, the melting of the Si substrate involves problems in practice.

JP 55-144500 A discloses producing a large SiC crystal layer by coating a Si substrate with a polycrystalline SiC layer by chemical vapor deposition after etching with hydrogen chloride. The Si substrate is then etched away with hydrogen fluoride. On the first SiC layer, a second SiC layer, which is likewise polycrystalline but comprises oriented crystallites is then deposited out of the gas phase.

According to JP 55-144500 A, a compound of a polycrystalline SiC layer and a Si layer is thus first obtained. However a polycrystalline layer is useless for semiconductor applications, even if the crystallites are well oriented.

The same problem of strong mechanical distortion, in particular with large-surface substrates, occurs in the methods of DE 36 13 012 A1 and DE 34 46 956 A1, according to which a beta SiC layer is grown on a monocrystalline Si layer by the CVD process, whereupon the Si layer is removed by means of an acid. On the monocrystalline beta SiC layer a monocrystalline alpha SiC layer is then grown.

The present invention is based on the problem of providing a relatively simple method for producing a large-surface wafer with a monocrystalline SiC layer which meets all requirements of semiconductor technology. This is achieved according to the method of the present invention.

Figure 1:
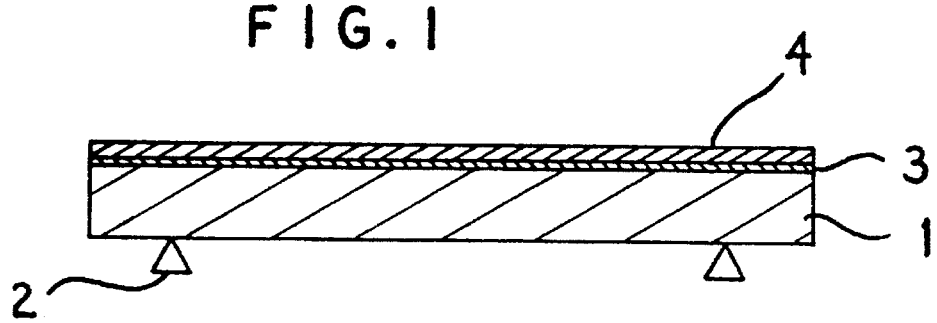
FIG. 1 shows the deposition of a monocrystalline SiC layer on a nucleation layer on the surface of a silicon substrate.

The invention is based on the surprising finding that a compound of a grown monocrystalline SiC layer and monocrystalline Si substrate no longer tears, or even curves appreciably, despite the very different coefficients of thermal expansion of Si and SiC, if a polycrystalline SiC layer is deposited on the monocrystalline SiC layer of this compound before the latter is cooled to etch away the Si substrate.

Unlike a compound of a grown monocrystalline SiC layer on a monocrystalline Si substrate, which curves greatly and whose monocrystalline SiC layer breaks when cooled from the epitaxial growing temperature of, for example 1300° to 1400° C. to room temperature due to the different coefficients of thermal expansion of SiC and Si, such a compound thus remains completely intact when cooled if a polycrystalline SiC layer has been deposited on the monocrystalline SiC layer.

When the Si substrate has been etched away one obtains, according to the invention, a self-supporting wafer consisting of a compound of a monocrystalline SiC layer and a polycrystalline SiC layer for producing components (circuits).

Due to the different lattice parameters and the different coefficients of thermal expansion of SiC and Si, however, the monocrystalline SiC layer has a relatively great dislocation density on the boundary surface with the Si carrier after growing on the latter. Although this density decreases with the distance from the boundary surface it nevertheless extends into the grown monocrystalline SiC layer.

A second monocrystalline SiC layer is therefore preferably deposited by homo-epitaxy on the first monocrystalline SiC layer of the compound of first monocrystalline SiC layer and polycrystalline SiC layer. This results in a wafer with a monocrystalline SiC layer of highest crystal quality.

The epitaxial growth of the monocrystalline SiC layer or layers and the growth of the polycrystalline SiC layer are preferably conducted out of the gas phase. For this purpose one uses, in particular, chemical vapor deposition (CVD) and molecular-beam epitaxy (MBE). To form the second monocrystalline SiC layer, one can also use a deposition method other than chemical vapor deposition, e.g. liquid-phase epitaxy (LPE).

One might also dope the first and second monocrystalline SiC layers differently.

The precondition for a monocrystalline SiC layer initially forming on the Si substrate (in contrast to JP 55-144500 A) is that the Si substrate is carbonized before the monocrystalline SiC layer is grown. For this purpose, the Si substrate is reacted with a carbonaceous gas, in particular a hydrocarbon such as methane, ethane, propane, ethylene or acetylene, or a halogen-containing hydrocarbon, so that a monocrystalline SiC nucleation layer having a thickness of up to 300 nanometers, preferably 20 to 200 nanometers, forms on the Si substrate surface.

However, the nucleation layer has a relatively high dislocation density. It is therefore preferably removed from the monocrystalline SiC layer of the compound of the monocrystalline SiC layer and the polycrystalline SiC layer after the Si substrate layer is etched away. For this purpose the outer surface of the monocrystalline SiC layer can be subjected e.g. to a wet-chemical etching method, for example, with a mixture of hydrogen fluoride and nitric acid, to thermal oxidation or to ion milling or plasma etching.

The inventive method is performed in a reactor with a chamber in which the monocrystalline silicon substrate is disposed on a heatable substrate holder. The corresponding gaseous compounds mixed with a carrier gas are fed successively to the chamber for producing the compound of the Si substrate, the monocrystalline SiC layer and the polycrystalline SiC layer.

The carrier gas used is generally argon, helium and/or hydrogen. The Si source may be mono- or disilane, including chlorine-containing mono- or disilane, for example silane ($SiH_4$), tetrachlorosilane ($SiCl_4$) or dichlorosilane ($SiCl_2 H_2$). The C source used for carbonizing the Si substrate and for forming SiC is preferably a hydrocarbon, such as methane, ethane, propane, ethylene or acetylene, including a halogen-containing hydrocarbon.

To form the monocrystalline SiC and the polycrystalline SiC layer, the Si substrate is heated on the substrate holder to, for example, 1300° to 1400° C. The same Si and C sources can also be used to produce the monocrystalline SiC layer and to produce the polycrystalline SiC layer.

However, the monocrystalline SiC layer is generally formed at a lower deposition rate. Using $CH_4/SiH_4$ as the C/Si sources with a ratio of volumes of e.g. 2:1 and a temperature of e.g. 1360° C, the deposition rate of SiC is thus at most, 10 microns per hour for forming a monocrystalline SiC layer, while under otherwise identical conditions but a higher $CH_4/SiH_4$ pressure, a deposition rate of preferably over 20 microns per hour is adjusted for forming the polycrystalline SiC layer.

That is, the formation of polycrystalline SiC is fundamentally to be expected at a higher mass flow of the Si and C sources and/or a lower temperature, while monocrystalline SiC arises at a lower mass flow of the Si and C sources and/or a higher temperature.

The thickness of the (first) monocrystalline SiC layer of the inventive wafer is preferably 0.05 to 100 microns, in particular 0.5 to 10 microns. The thickness of the polycrystalline SiC layer, which is generally thicker than the monocrystalline SiC layer, is preferably 5 to 500 microns, in particular 50 to 150 microns.

The monocrystalline SiC obtained by epitaxial growth on the monocrystalline Si substrate is of the beta type. The monocrystalline SiC layer can be grown both on the (1 1 1) surface and on the (1 1 0) or (1 0 0) surface of the Si substrate. In no case can any appreciable curvature of the compound of monocrystalline Si layer, monocrystalline SiC layer and polycrystalline SiC layer be detected after it is removed from the reaction chamber and cooled to room temperature for etching away the Si carrier layer.

This is worth mentioning because when a compound of a monocrystalline SiC layer grown on the (1 1 1) surface of a monocrystalline Si layer is cooled, one detects particularly great curvature of the compound and destruction of the monocrystalline SiC layer.

The Si carrier layer is preferably etched away by wetchemical means, in particular, with an etchant containing hydrogen fluoride.

When the Si carrier layer and possibly the nucleation layer have been etched away, the compound of monocrystalline SiC layer and polycrystalline SiC layer can be returned to the reaction chamber to grow a further monocrystalline SiC layer with the same or different doping on the monocrystalline SiC layer by homo-epitaxy.

Using the inventive method, one can readily produce wafers with a diameter of e.g. 15 centimeters and more, i.e. a surface of several 100 square centimeters, with impeccable crystal quality. No microcracks have been detected, even in the largest wafers hitherto produced. The curvature of the wafers is also so small as to be negligible.

As experiments have shown, an inventively produced wafer with a diameter of 75 millimeters consisting of a compound of a monocrystalline SiC layer and a polycrystalline SiC layer has a curvature with a radius of curvature of more than 3 meters. The wafer is thus virtually flat.

It can thus be put on a flat substrate holder and held there for example by vacuum suction. The flat wafer can thus be provided with an exact circuit structure, for example, by photolithography.

By contrast, conventional wafers of monocrystalline SiC have a maximum diameter of a few centimeters. That means many more components (circuits) can be produced with the inventively produced large wafers than with conventional monocrystalline SiC wafers with the same handling times.

The drawings illustrates the inventive method using a flow chart.

According to FIG. 1, a monocrystalline silicon substrate 1 disposed on substrate holder 2 is heated in a chamber not shown. After carbonization of the surface of silicon substrate 1 to form nucleation layer 3, monocrystalline SiC layer 4 is deposited thereon by hetero-epitaxial growth.

Figure 2:
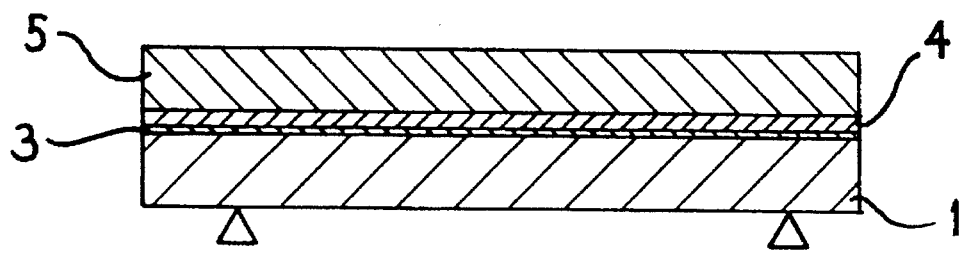
FIG. 2 shows the deposition of a polycrystalline Sic layer on the monocrystalline SiC layer of FIG. 1.

According to FIG. 2, polycrystalline SiC layer 5 is then deposited out of the gas phase on mono SiC layer 4.

Figure 3:
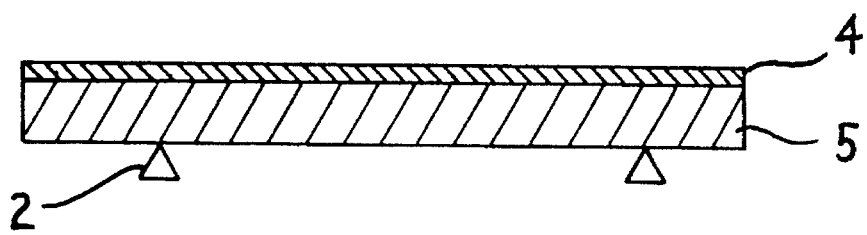
FIG. 3 shows the removal of the silicon substrate and nucleation layer from the monocrystalline and polycrystalline SiC layers of FIG. 2.

According to FIG. 3, compound of monocrystalline Si substrate 1, including nucleation layer 3, and monocrystalline SiC layer 4 and polycrystalline SiC layer 5 is then cooled, monocrystalline Si substrate 1 removed by wetchemical means and the resulting compound of polycrystalline silicon carbide layer 5 as the carrier and monocrystalline silicon carbide layer 4 is disposed so that polycrystalline silicon carbide layer 5 lies on substrate holder 2. Nucleation layer 3 can optionally be removed beforehand.

Figure 4:
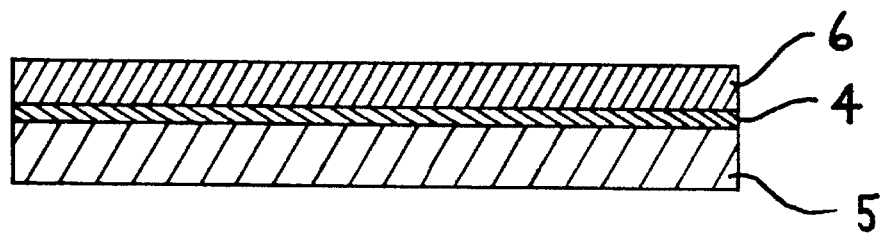
FIG. 4 illustrates the formation of a low-defect monocrystalline silicon carbide layer on the monocrystalline SiC layer of FIG. 3.

According to FIG. 4, a second, low-defect monocrystalline silicon carbide layer 6 is then grown on the first monocrystalline silicon carbide layer 1 (possibly with nucleation layer 3) so as to form the compound of polycrystalline silicon carbide layer 5, first monocrystalline silicon carbide layer 4 and low-defect second monocrystalline silicon carbide layer 6 shown in FIG. 4.

The following example shall explain the invention further.

A monocrystalline Si substrate wafer with a diameter of 75 millimeters is put in a reactor on a substrate holder. The substrate holder is heated to a temperature of 1360° C. At a reduced pressure a mixture of hydrogen and methane is fed to the reactor to carbonize the surface of the Si substrate wafer, at a mass flow of 500 $cm^3$/min $H_2$ and 50 $cm^3$/min $CH_4$. Carbonization is completed after a few minutes.

To form the monocrystalline SiC layer a mixture of hydrogen, methane and silane is fed at a reduced pressure to the reactor at the same temperature of the substrate holder, at a mass flow of 500 $cm^3$/min $H_2$, 25 $cm^3$/min $CH_4$ and 15 $cm^3$/min $SiH_4$, until the layer thickness of the monocrystalline SiC layer is 5 microns. The polycrystalline SiC layer is formed under the same conditions as the monocrystalline SiC layer but at higher $CH_4$ and $SiH_4$ mass flows, namely 500 $cm^3$/min $H_2$, 100 $cm^3$/min $CH_4$ and 50 $cm^3$/min $SiH_4$.

After cooling, the Si substrate layer is etched away with

HF+ HNO$_3$. The resulting wafer is free from cracks and completely flat.

We claim:

1. A method of producing a wafer with a monocrystalline silicon carbide layer comprising the steps of: providing a monocrystalline silicon substrate; carbonizing a surface of the substrate to form a monocrystalline silicon carbide nucleation layer; forming a monocrystalline silicon carbide layer on the monocrystalline silicon carbide nucleation layer; forming a polycrystalline silicon carbide layer on the monocrystalline silicon carbide layer, cooling the silicon substrate, monocrystalline silicon carbide nucleation layer, monocrystalline silicon carbide layer and polycrystalline silicon carbide layer; and removing the silicon substrate to produce a wafer having a monocrystalline silicon carbide layer and a polycrystalline silicon carbide layer.

2. The method of claim 1, wherein a second monocrystalline silicon carbide layer is grown epitaxially on the monocrystalline silicon carbide layer to obtain a wafer having a polycrystalline silicon carbide layer, a first monocrystalline silicon carbide layer and a second monocrystalline silicon carbide layer.

3. The method of claim 2, wherein the formation of the first monocrystalline silicon carbide layer, the second monocrystalline silicon carbide layer and the polycrystalline silicon carbide layer takes place out of the gas phase.

4. The method of claim 1, wherein the carbonization is performed by chemically reacting a carbonaceous gas with the surface of the silicon substrate.

5. The method of claim 1, wherein the nucleation layer on the surface of the monocrystalline silicon carbide layer is removed after the silicon substrate is removed.

* * * * *